(12) United States Patent
Kawata et al.

(10) Patent No.: US 10,587,263 B2
(45) Date of Patent: Mar. 10, 2020

(54) LOAD DRIVE APPARATUS

(71) Applicant: HITACHI AUTOMOTIVE SYSTEMS, LTD., Ibaraki (JP)

(72) Inventors: Takahiro Kawata, Hitachinaka (JP); Yoichiro Kobayashi, Hitachinaka (JP); Mitsuhiko Watanabe, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 0 days.

(21) Appl. No.: 16/469,537

(22) PCT Filed: Nov. 6, 2017

(86) PCT No.: PCT/JP2017/039863
§ 371 (c)(1),
(2) Date: Jun. 13, 2019

(87) PCT Pub. No.: WO2018/110141
PCT Pub. Date: Jun. 21, 2018

(65) Prior Publication Data
US 2019/0305772 A1 Oct. 3, 2019

(30) Foreign Application Priority Data

Dec. 14, 2016 (JP) .................. 2016-242287

(51) Int. Cl.
| H01L 25/00 | (2006.01) |
| H03K 17/687 | (2006.01) |
| G01R 31/26 | (2020.01) |
| H01L 27/12 | (2006.01) |

(Continued)

(52) U.S. Cl.
CPC .......... *H03K 17/687* (2013.01); *G01R 31/26* (2013.01); *G01R 31/2621* (2013.01);
(Continued)

(58) Field of Classification Search
CPC ............ H03K 17/687; H03K 17/6877; H03K 17/063; H03K 17/04126; H03K 17/0822;
(Continued)

(56) References Cited

U.S. PATENT DOCUMENTS 6,538,945 B2 * 3/2003 Takemura .............. G11C 7/065
257/E21.633
RE46,773 E 4/2018 Onishi et al.
(Continued)

FOREIGN PATENT DOCUMENTS

| JP | H08-083830 A | 3/1996 |
| JP | 2002-343855 A | 11/2002 |

(Continued)

OTHER PUBLICATIONS

International Search Report, WO 2018/110141 A1, dated Jan. 30, 2018.

*Primary Examiner* — Long Nguyen
(74) *Attorney, Agent, or Firm* — Volpe and Koenig, P.C.

(57) ABSTRACT

Provided are a load drive apparatus in which a semiconductor chip using DTI for inter-element separation is mounted, the load drive apparatus being capable of diagnosing a dielectric strength voltage of the DTI and highly reliable and a failure diagnosis method of the load drive apparatus. There is provided a load drive apparatus in which a semiconductor chip is mounted. The semiconductor chip includes a load drive output unit formed on a semiconductor substrate. The load drive output unit has a first region where an MOSFET that controls load driving is formed and a second region insulated and separated by DTI from the first region and includes a first leakage current detection element provided in the first region, a second leakage current detection element provided in the second region, and a failure detection unit that determines a failure of the load drive output unit.

12 Claims, 7 Drawing Sheets

(51) Int. Cl.
*H02M 7/48* (2007.01)
*H01L 21/76* (2006.01)
*H01L 27/04* (2006.01)
*H01L 21/762* (2006.01)
*H01L 21/822* (2006.01)
*H02P 25/04* (2006.01)
*H02P 27/06* (2006.01)

(52) U.S. Cl.
CPC ............ *H01L 21/76* (2013.01); *H01L 21/762* (2013.01); *H01L 21/822* (2013.01); *H01L 27/04* (2013.01); *H01L 27/1203* (2013.01); *H02M 7/48* (2013.01); *H02P 25/04* (2013.01); *H02P 27/06* (2013.01)

(58) Field of Classification Search
CPC ...... H03K 17/567; H03K 17/94; H03K 3/017; H03K 7/08; H03K 19/00361; G01R 31/26; G01R 31/2621; H01L 21/176; H01L 21/762; H01L 21/822; H01L 27/04; H01L 27/1203; H02M 7/48; H02P 25/04; H02P 27/06; H04L 25/028; G06F 11/1443
See application file for complete search history.

(56) References Cited

U.S. PATENT DOCUMENTS

| | | |
|---|---|---|
| 2011/0175205 A1 | 7/2011 | Morii et al. |
| 2016/0043067 A1 | 2/2016 | Yamaji et al. |
| 2017/0092759 A1 | 3/2017 | Okuda et al. |
| 2018/0130785 A1* | 5/2018 | Wang ................ H01L 21/02068 |
| 2019/0057873 A1* | 2/2019 | Sugahara ................ H01L 21/28 |

FOREIGN PATENT DOCUMENTS

| | | |
|---|---|---|
| JP | 2006-215454 A | 8/2006 |
| JP | 2007-189096 A | 7/2007 |
| JP | 2008-098346 A | 4/2008 |
| JP | 2009-194791 A | 8/2009 |
| JP | 2011-151121 A | 8/2011 |
| JP | 2014-235060 A | 12/2014 |
| JP | 2015-122543 A | 7/2015 |
| JP | 2016-092338 A | 5/2016 |
| JP | 2016-208329 A | 12/2016 |
| WO | 2015/053022 A1 | 4/2015 |

* cited by examiner

LOAD DRIVE APPARATUS

TECHNICAL FIELD

The present invention relates to a load drive apparatus including a semiconductor chip including deep trench isolation (hereinafter referred to as DTI) that is one of inter-element insulation separation structures, and more particularly to a load drive apparatus including a drive circuit and an in-vehicle electronic control unit using the load drive apparatus.

BACKGROUND ART

For electronic control units to be mounted on vehicles, electric actuators such as motors and solenoids for converting electric signals into mechanical motions and hydraulic pressure are widely used as various objects to be controlled are electronically controlled. To drive these electric actuators, a load drive apparatus including a drive circuit including a semiconductor chip is used.

In the semiconductor chip of these load drive apparatuses, DTI that is one of insulation separation methods is used for the purpose of blocking noises and maintaining a potential difference when the drive circuit is integrated in the semiconductor chip.

As a background art in this technical field, there is a technique such as PTL 1. PTL 1 discloses a semiconductor device including a semiconductor substrate having a trench on a main surface thereof and an element formed on the main surface of the semiconductor substrate and having a conductive portion, the trench being formed so as to surround the element in plan view, the semiconductor device further including an insulating film formed on the element and in the trench so that the insulating film covers over the element and forms a hollow in the trench, the insulating film having a hole reaching the conductive portion.

In addition, PTL 2 discloses a semiconductor device including a semiconductor substrate having a structure in which a supporting substrate, a buried insulating film, and a semiconductor layer are stacked in this order and an element formed on a main surface of the semiconductor layer and having a conductive portion, the semiconductor device including a trench formed in the semiconductor layer so that the trench surrounds the element in plan view and reaches the buried insulating film from the main surface of the semiconductor layer, the semiconductor device further including a first insulating film formed on the element so that the first insulating film covers over the element and forms a hollow in the trench, the first insulating film having a hole formed to reach a conductive portion.

PTL 1 is a technique relating to a structure in which DTI is provided on an ordinary silicon substrate or a so-called bulk substrate, and PTL 2 is a technique relating to a structure in which the DTI is provided on a silicon on insulator (hereinafter referred to as SOI)

In addition, as an example of the load drive apparatus, there is a motor drive circuit as illustrated in FIG. 9. The motor drive circuit in FIG. 9 includes an inverter circuit INV including an FETH and an FETL that are filed effect transistors (FETs) that drive a motor, and a pre-driver circuit PDRV including a semiconductor chip 1.

In the semiconductor chip 1, input signals INH and INL are gone through a logic circuit LOGIC, a high-side driver circuit DRVH, and a high-side driver circuit DRVL, and a load drive output unit 3H that has OUTH as an output and a low-side load drive output unit 3L that has an OUTL as an output are driven, using gate signals GATEH0, GATEH1, GATEL0, and GATEL1. Here, the load drive output units 3H and 3L each includes a metal oxide semiconductor field effect transistors (hereinafter referred to as MOSFET) such as a laterally diffused MOS (LDMOS).

CITATION LIST

Patent Literature

PTL 1: JP 2015-122543 A
PTL 2: JP 2011-151121 A

SUMMARY OF INVENTION

Technical Problem

Incidentally, in a case where an open failure or a short failure occurs between a load such as a motor or a solenoid and an output of a drive circuit when the load is driven, an excessive surge occurs due to an L component of the load and there is a possibility that a load drive output unit breaks down.

For example, in the motor drive circuit illustrated in FIG. 9 described above, in a case where an open failure or a short failure occurs between the inverter circuit INV and the motor, an excessive surge occurs due to the L component of the motor and there is a possibility that the inverter circuit INV breaks down. Furthermore, there is a possibility that the load drive output unit 3H or 3L that is an output unit of the pre-driver circuit PDRV also breaks down.

Even if the excessive surge does not lead to an instantaneous destruction, a dielectric strength voltage of DTI lowers due to the influence of a disturbance surge at the time of using the load drive apparatus or aged deterioration, electrical isolation (insulation separation) between circuit blocks and between elements become insufficient and there is a possibility that a driving function is lost in due course.

Meanwhile, due to the progress of miniaturization, high integration, and high heat dissipation of semiconductor chips in recent years, it is required to reduce the thickness of a DTI insulating film. However, by reducing the film thickness of the DTI insulating film, a dielectric strength voltage of the DTI lowers and therefore, it becomes necessary to check the dielectric strength voltage.

The above-mentioned PTL 1 and PTL 2 all relate to a structure of a semiconductor chip using the DTI for element isolation on the semiconductor substrate, but do not describe the above-mentioned problems and solution to the problems.

The present invention has been made in view of the above problems, and it is an object of the present invention to provide a load drive apparatus in which a semiconductor chip using DTI for inter-element separation is mounted, the load drive apparatus being capable of diagnosing the dielectric strength voltage of the DTI and highly reliable.

In addition, another object of the present invention is to provide a failure diagnosis method of a load drive apparatus in which a semiconductor chip using the DTI for inter-element separation is mounted, the load drive apparatus being capable of diagnosing a failure caused by lowering of the dielectric strength voltage of the DTI due to the influence of a disturbance surge at the time of using the load drive apparatus or aged deterioration.

Solution to Problem

In order to achieve the above object, the present invention is a load drive apparatus in which a semiconductor chip is mounted, the semiconductor chip includes a load drive output unit formed on a semiconductor substrate, the load drive output unit has a first region where an MOSFET that controls load driving is formed and a second region insulated and separated by DTI from the first region, and the load drive output unit includes a first leakage current detection element provided in the first region, a second leakage current detection element provided in the second region, and a failure detection unit that determines a failure of the load drive output unit.

Advantageous Effects of Invention

According to the present invention, it is possible to achieve the load drive apparatus that is capable of diagnosing the dielectric strength voltage of the DTI used for inter-element separation and highly reliable.

In addition, according to the present invention, it is possible to diagnose a failure caused by lowering of the dielectric strength voltage of the DTI due to the influence of the disturbance surge at the time of using the load drive apparatus or aged deterioration, and it is possible to improve reliability of the load drive apparatus.

Note that problems, configurations, and effects other than those described above will be clarified by the description of embodiments below.

DESCRIPTION OF EMBODIMENTS

Figure 1:
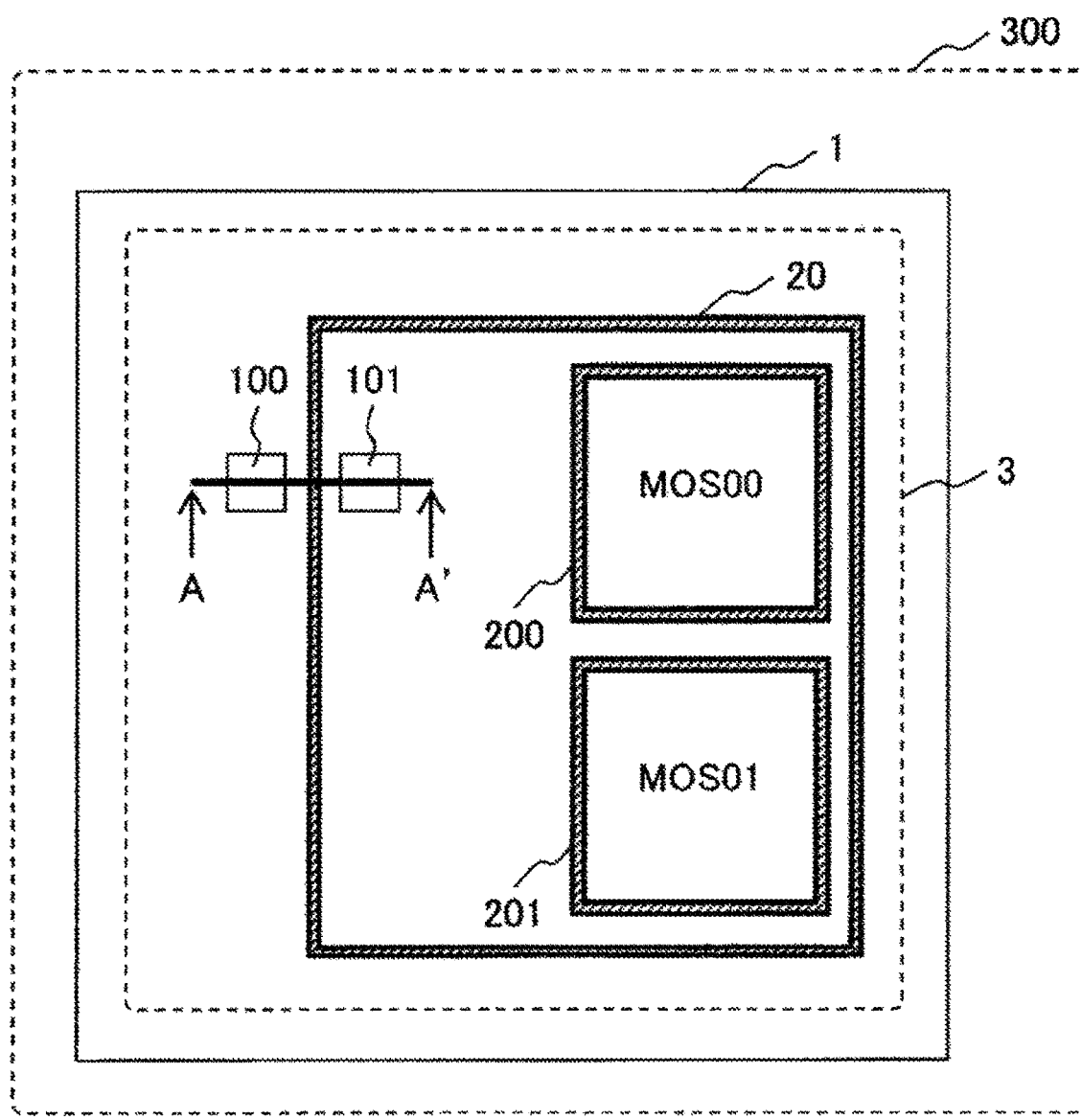
FIG. 1 is a plan view illustrating an overall outline of a load drive apparatus including a semiconductor chip according to a first embodiment of the present invention.

Hereinafter, embodiments of the present invention will be described with reference to the drawings. Note that since the drawings are simplified, the technical scope of the present invention should not be construed narrowly on the basis of the description of the drawings. In addition, the same elements are denoted by the same reference numerals, and redundant description thereof is omitted.

First Embodiment

In a first embodiment of the present invention, with reference to FIGS. 1 to 4, description will be given regarding a configuration and operation of a load drive apparatus that makes it possible to diagnose that a dielectric strength voltage of DTI lowers due to the influence of a disturbance surge or aged deterioration during use of a load drive apparatus, the load drive apparatus being capable of improving the reliability.

FIG. 1 is a plan view illustrating an overall outline of the load drive apparatus including a semiconductor chip according to a first embodiment of the present invention.

As illustrated in FIG. 1, the load drive apparatus 300 according to the present embodiment includes a semiconductor chip 1 including a load drive output unit 3, and the load drive output unit 3 includes DTI 20 that is an inter-element insulation separation structure formed so as to surround an metal-oxide semiconductor (MOS) 00 and an MOS 01 that are MOSFETs.

A first leakage current detection element 101 is formed inside the inter-element insulation separation structure DTI 20, that is, in a region where elements such as the MOS 00 and the MOS 01 are formed, and a second leakage current detection element 100 is formed outside the inter-element insulation separation structure DTI 20, that is, a region where the elements such as the MOS 00 and the MOS 01 are not formed.

Figure 3:
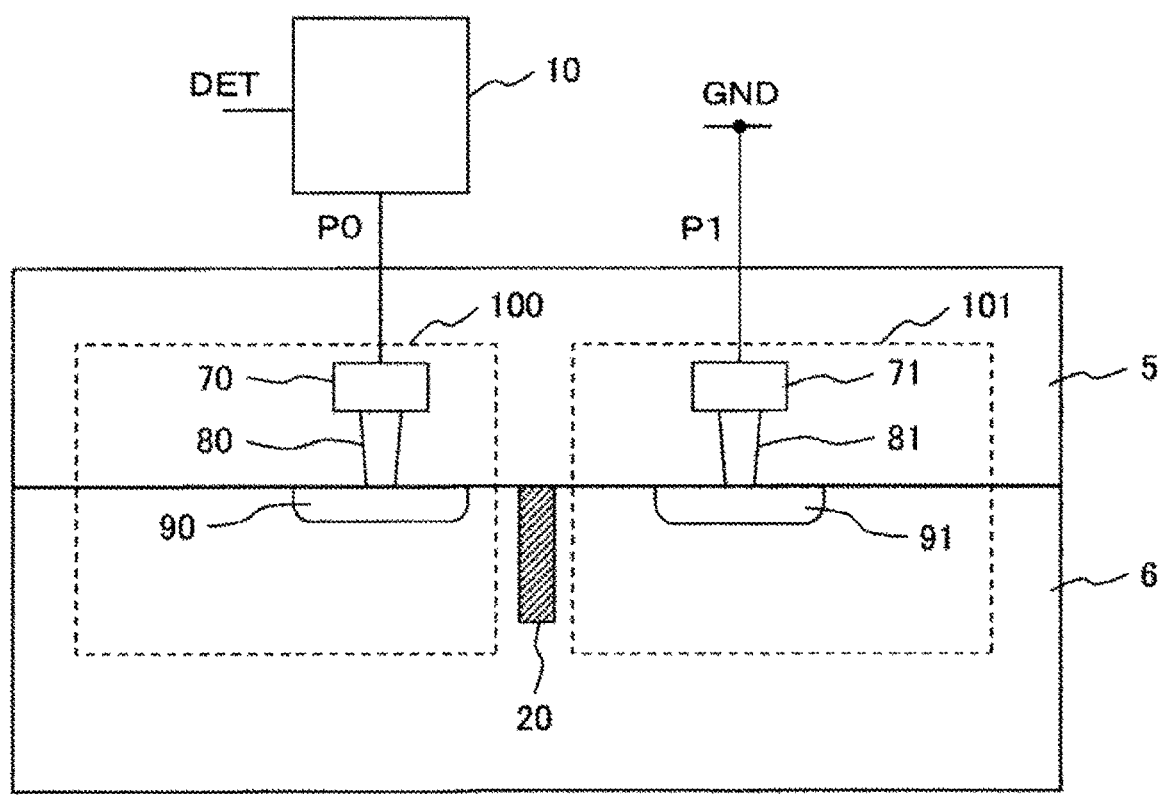
FIG. 3 is a diagram illustrating a section taken along line A-A' of FIG. 1 and a failure detection unit 10.
Figure 4:
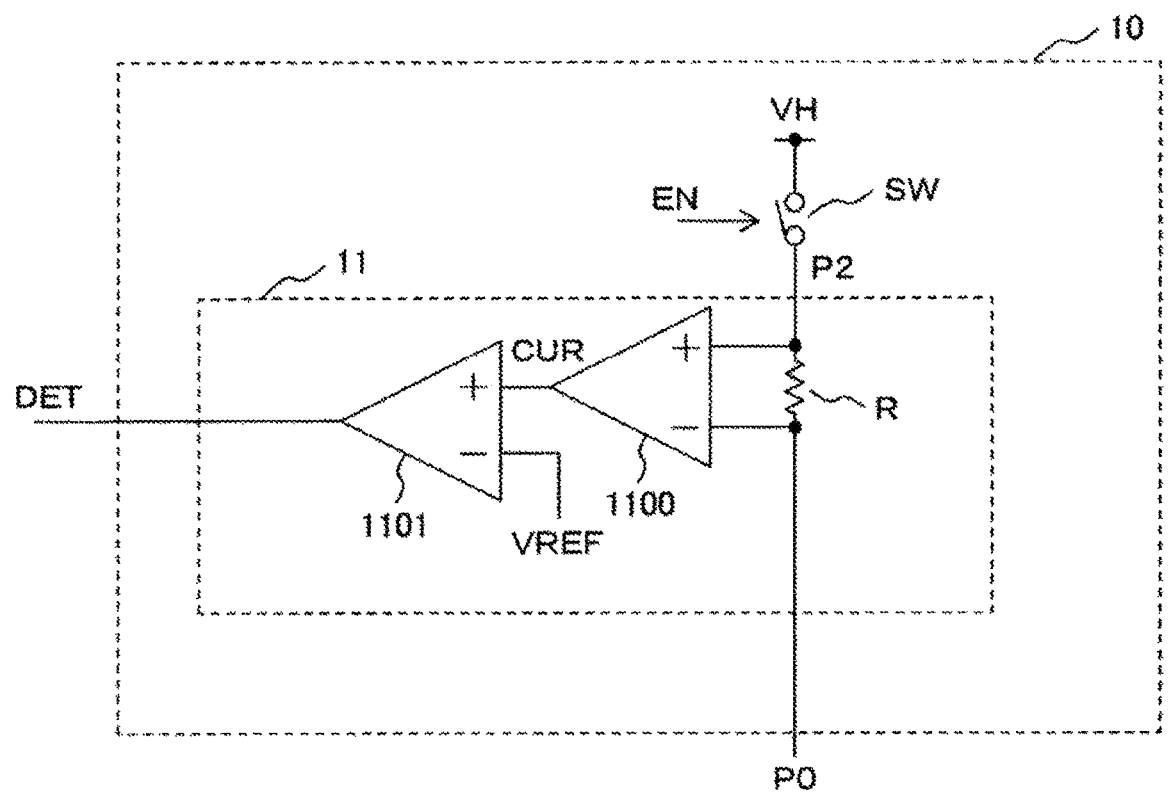
FIG. 4 is a block diagram illustrating a configuration example of the failure detection unit 10 in FIG. 3.

In addition, as illustrated in FIGS. 3 and 4 to be described later, there is included a failure detection unit 10 that determines that the load drive apparatus 300 is faulty in a case where a current equal to or more than a predetermined value is detected when a potential difference is provided between the first leakage current detection element 101 and the second leakage current detection element 100.

Here, as illustrated in FIG. 1, the MOS 00 and the MOS 01 that are MOSFETs may be surrounded by DTI 200 and DTI 201, respectively.

Figure 2:
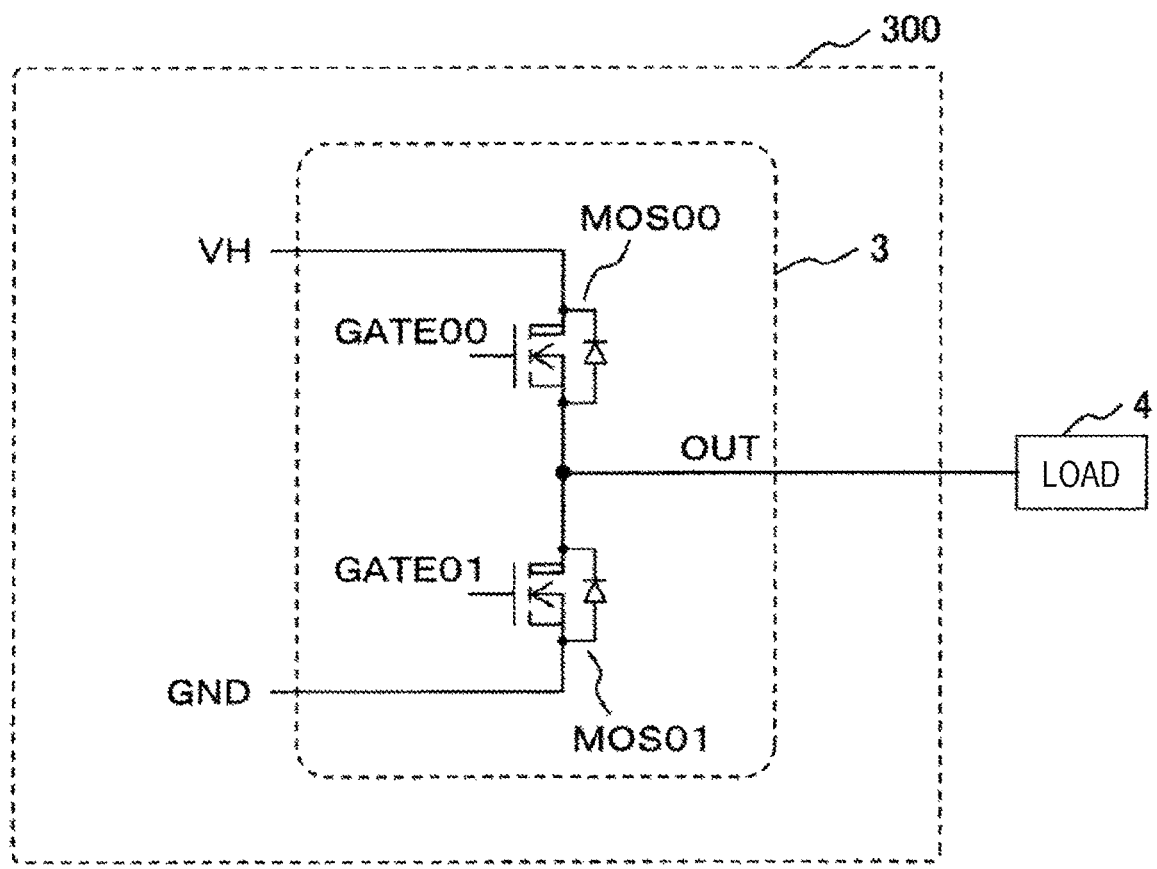
FIG. 2 is a diagram illustrating an example of an output circuit of the load drive apparatus in FIG. 1.

FIG. 2 illustrates an example of an output circuit of the load drive apparatus 300 in FIG. 1. The load drive output unit 3 of the load drive apparatus 300 includes the MOS 00 that is an Nch LDMOS whose drain side is connected to a power source VH and whose source side is connected to an output OUT and the MOS 01 that is an Nch LDMOS whose drain side is connected to the output OUT and whose source side is connected to a ground GND. The output OUT is connected to a load 4, and the load 4 is driven by turning on and off between the drain and the source of the LDMOS that is the MOSFET, on the basis of a H level and an L level of a gate signal GATE00 of the MOS 00 and a gate signal GATE01 of the MOS 01.

FIG. 3 is a view illustrating a cross-sectional view of the leakage current detection element 100 formed outside the DTI 20 of the load drive output unit 3 shown in FIG. 1 and the leakage current detection element 101 formed inside the DTI 20 taken along A-A' line and an example of the failure detection unit 10. The leakage current detection elements 100 and 101 includes, for example, semiconductor layers 90 and 91 each including an n-type silicon layer on a semiconductor substrate 6 including p-type silicon, conductive layers 80 and 81 including tungsten, wiring 70 and 71 including, for example, aluminum, and an interlayer film 5 including, for example, a silicon oxide film.

Here, the DTI 20 is formed in the region of the semiconductor substrate 6 between the leakage current detection element 100 and the leakage current detection element 101. It is preferable that an aspect ratio (depth to a width) of the DTI 20 is 1 or more. Nodes P0 and P1 are formed by wiring 70 and 71, respectively. The node P0 is connected to the failure detection unit 10, and the failure detection unit 10 outputs a failure detection signal DET. Meanwhile, the node P1 is connected to the ground GND.

With reference to FIG. 4, description will be given regarding a configuration example for performing a failure diagnosis regarding that the dielectric strength voltage of the DTI 20 lowers, the failure diagnosis being performed by the leakage current detection elements 100 and 101 illustrated in FIGS. 1 and 3.

FIG. 4 is a block diagram illustrating an example of the failure detection unit 10 illustrated in FIG. 3. The failure detection unit 10 includes a current detection circuit 11 and a switch SW that turns on between the power source VH and a node P2 by an enable signal EN when the EN signal is at an H level and turns off when the EN signal is at an L level. The current detection circuit 11 includes a current detection resistor R included between the node P2 and the node P0, an amplifier circuit 1100 that amplifies and outputs a potential difference between both terminals (P2-P0) of the current detection resistor R, a comparator circuit 1101 that compares an output voltage signal CUR of the amplifier circuit 1100 with a reference voltage VREF, and the failure detection signal DET that is an output signal of the comparator circuit 1101.

Next, description will be given regarding operation for performing the failure diagnosis regarding that the dielectric strength voltage of the DTI 20 illustrated in FIGS. 1 and 3 lowers, the failure diagnosis being performed by the failure detection unit 10 illustrated in FIG. 4.

The switch SW is turned on by changing the enable signal EN illustrated in FIG. 4 from L to H and the power source voltage VH is applied to the node P2 of the current detection circuit 11. Thus, it is possible to apply the power source voltage VH to the leakage current detection element 100 illustrated in FIGS. 1 and 3 and apply the ground GND to the leakage current detection element 101, and it is possible to set a potential difference VH between the leakage current detection elements 100 and 101.

At this time, the output voltage signal CUR illustrated in FIG. 4 is determined by a product of a current flowing from the power source VH to the node P0 and the current detection resistor R. In addition, the failure detection signal DET is output at the L level when the output voltage signal CUR is smaller than the reference voltage VREF and is output at the H level when the output voltage signal CUR is larger than the reference voltage VREF. When the dielectric strength voltage between the leakage current detection elements 100 and 101 lowers due to the DTI 20, impedance between the nodes P0 and P1 via the semiconductor substrate 6 lowers, the leak current flowing from the node P0 to the node P1 increases, and the output voltage signal CUR increases. By setting the voltage level of the appropriate reference voltage VREF in advance, it is possible to determine that the leakage current equal to or more than a predetermined value is detected, on the basis of that the voltage level of the failure detection signal DET switches from the L level to the H level, and to diagnose that the dielectric strength voltage of the DTI 20 lowers.

Figure 5:
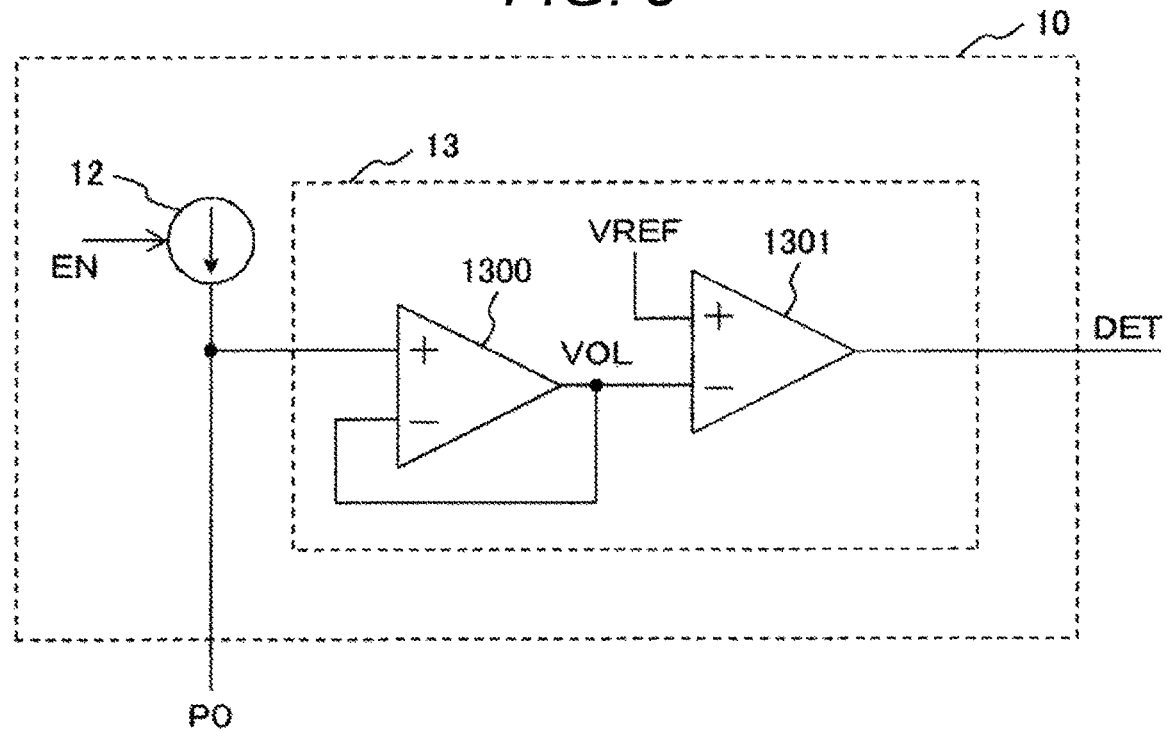
FIG. 5 is a block diagram illustrating another configuration example (modification) of the failure detection unit 10 in FIG. 3.

FIG. 5 is a block diagram illustrating another configuration example (modification) of the failure detection unit 10 illustrated in FIG. 3. With reference to FIG. 5, description will be given regarding another configuration example for performing a failure diagnosis regarding that the dielectric strength voltage of the DTI 20 lowers, the failure diagnosis being performed by the leakage current detection elements 100 and 101 illustrated in FIGS. 1 and 3.

FIG. 5 is a block diagram illustrating another configuration example different from that of FIG. 4 of the failure detection unit 10 illustrated in FIG. 3. A current source 12 controlled by an enable signal EN, and a voltage detection circuit 13 having the failure detection signal DET as an output signal are included. The voltage detection circuit 13 includes a buffer circuit 1300 and a comparator circuit 1301. When the enable signal EN is at the H level, a current amount I is injected from the current source 12 to the node P0.

The voltage level of the node P0 is output to VOL by the buffer circuit 1300. Note that it is assumed that the input of the buffer circuit 1300 is HiZ reception and the flow of the current amount I injected from the current source 12 to the node P0 into the buffer circuit 1300 can be ignored. By the comparator circuit 1301 that compares the output a voltage VOL of the buffer circuit 1300 with the reference voltage VREF, the failure detection signal DET is output at the L level when the VOL voltage is higher than the reference voltage VREF and the failure detection signal DET is output at the H level when the VOL voltage is smaller than the reference voltage VREF.

Next, description will be given regarding operation for performing a failure diagnosis regarding that the dielectric strength voltage of the DTI 20 illustrated in FIGS. 1 and 3 lowers, the failure diagnosis being performed by the failure detection unit 10 illustrated in FIG. 5.

With respect to the DTI 20 illustrated in FIGS. 1 and 3, when the dielectric strength voltage (dielectric strength voltage of the DTI 20) between the leakage current detection elements 100 and 101 lowers, the impedance between the nodes P0 and P1 via the semiconductor substrate 6 lowers. Therefore, when the current amount I is injected into the node P0 by the current source 12 illustrated in FIG. 5, the voltage level of the node P0 lowers, the voltage VOL level also lowers, and the voltage level of an appropriate reference voltage VREF is previously determined. As a result, it is possible to perform a failure diagnose regarding that the dielectric strength voltage of the DTI 20 lowers, on the basis of that the voltage level of the failure detection signal DET switching from L to H level.

By changing the enable signal EN from the L level to the H level, it is possible to perform the failure diagnosis using the failure detection unit 10 illustrated in FIGS. 4 and 5. In a case where the load drive apparatus 300 is an electronic control unit applied to a vehicle, the failure diagnosis may be performed on-board.

Note that the semiconductor leakage current has a characteristic of exponentially increasing with respect to temperature. In view of this, by performing the failure diagnosis immediately after the load drive apparatus performs load driving and before the power source is turned off, it is possible to perform the failure diagnosis in a state in which the temperature of the semiconductor chip rises due to heat generation caused by the load driving by the load drive output unit. Therefore, it is possible to perform the failure diagnosis more sensitively.

As described above, it is possible to diagnose that the dielectric strength voltage of the DTI lowers due to the influence of the disturbance surge or the aged deterioration at the time of using the load drive apparatus, and it is possible to improve the reliability of the load drive apparatus.

Figure 6:
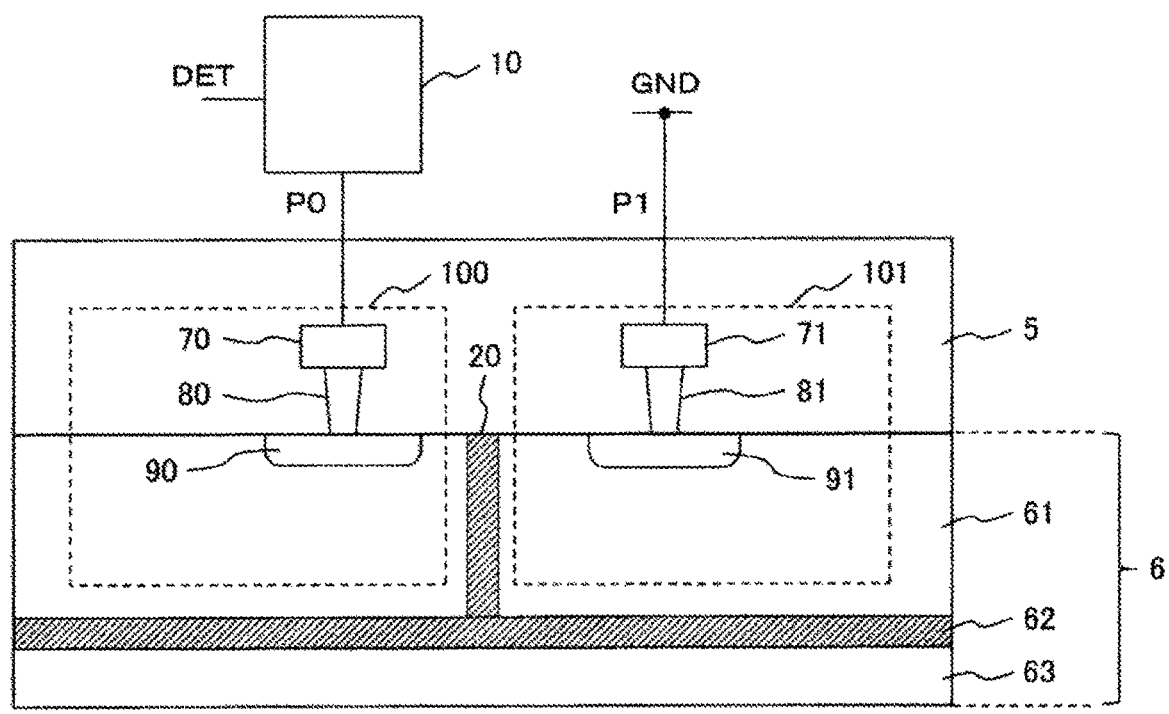
FIG. 6 is a diagram illustrating a section taken along line A-A' of FIG. 1 and another example (modification) of the failure detection unit 10 in FIG. 1.

Note that as illustrated in FIG. 6, if a silicon on insulator (SOI) substrate having a configuration in which a supporting substrate 63, a buried insulating film 62, and a semiconductor layer 61 are stacked is used as the semiconductor substrate 6 illustrated in FIG. 3, the same effect can be obtained.

Second Embodiment

In a second embodiment of the present invention, description will be given regarding a configuration and operation of a load drive apparatus that makes it possible to diagnose that a dielectric strength voltage of DTI lowers due to the influence of a disturbance surge or aged deterioration at the time of using the load drive apparatus, the load drive apparatus making it possible to switch to a redundant system after diagnosing that the electrical isolation of a redundant system circuit block does not cause a problem in a case of a configuration in which a load drive output unit is made redundant, the load drive apparatus being capable of improving reliability.

Figure 7:
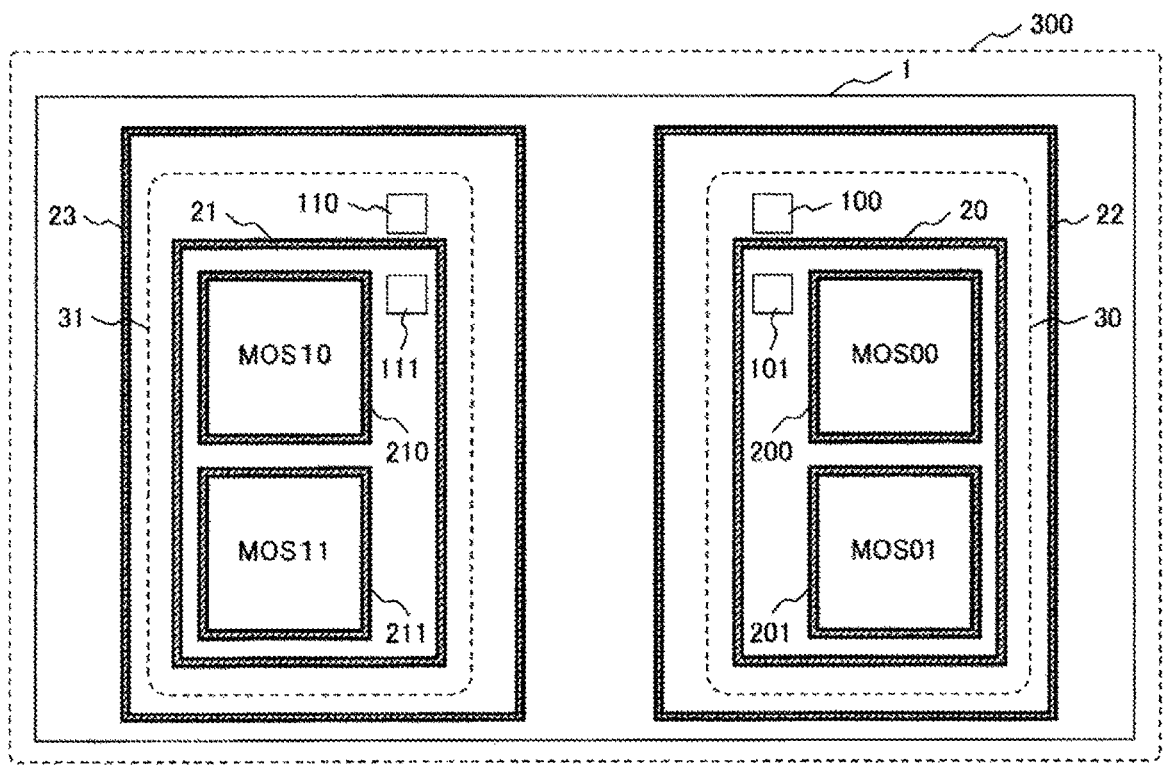
FIG. 7 is a plan view illustrating an overall outline of a load drive apparatus including a semiconductor chip according to a second embodiment of the present invention.

FIG. 7 is a plan view illustrating an overall outline of the load drive apparatus including a semiconductor chip according to a second embodiment of the present invention.

Compared with FIG. 1 of the first embodiment, the present embodiment is different in that the present embodiment includes, in addition to a load drive output unit 30 of a main circuit (corresponding to the load drive output unit 3 of FIG. 1), a redundant output unit 31 used as a redundant system of the load drive output unit 30. By switching to the load drive output unit (redundant output unit) 31 of a redundant circuit when the load drive function of the load drive output unit 30 of the main circuit is lost, it is possible to maintain the load drive function of the load drive apparatus 300.

As an example of making the load drive output unit redundant, it is studied to improve safety and reliability by making functions redundant in a vehicle system such as electric power steering (EPS) including a motor drive circuit. A failure probability of the motor drive unit is high relative to other parts. Therefore, by making the load drive output unit redundant, it is possible to switch to a redundant system even if the load drive output unit fails and it is possible to prevent the drive function from being lost and to improve the reliability of the system.

As illustrated in FIG. 7, the load drive apparatus 300 according to the present embodiment includes a semiconductor chip 1 including the load drive output unit 30, and the load drive output unit 30 includes DTI 20 that is an inter-element insulation separation structure formed so as to surround the MOS 00 and the MOS 01 that are MOSFETs.

A first leakage current detection element 101 is formed inside the inter-element insulation separation structure DTI 20, that is, in a region where elements such as the MOS 00 and the MOS 01 are formed, and a second leakage current detection element 100 is formed outside the inter-element insulation separation structure DTI 20, that is, a region where the elements such as the MOS 00 and the MOS 01 are not formed.

In addition, as illustrated in FIGS. 3 and 4 described in the first embodiment, there is included a failure detection unit 10 that determines that the load drive apparatus 300 is faulty in a case where a current equal to or more than a predetermined value is detected when a potential difference is provided between the first leakage current detection element 101 and the second leakage current detection element 100. (not illustrated in FIG. 7)

The semiconductor chip 1 according to the present embodiment includes a load drive output unit (redundant output unit) 31 provided in a redundant circuit, apart from the load drive output unit 30 of a main circuit. The load drive output unit (redundant output unit) 31 includes DTI 21 that is an inter-element insulation separation structure formed so as to surround an MOS 10 and an MOS 11 that are MOSFETs.

A third leakage current detection element 111 is formed inside the inter-element insulation separation structure DTI 21, that is, in a region where elements such as the MOS 10 and the MOS 11 are formed, and a fourth leakage current detection element 110 is formed outside the inter-element insulation separation structure DTI 21, that is, in a region where elements such as the MOS 10 and the MOS 11 are not formed.

The load drive apparatus 300 according to the present embodiment is configured as described above and switches from the load drive output unit 30 to the load drive output unit (redundant output unit) 31 in a case where when a potential difference is provided between the first leakage current detection element 101 and the second leakage current detection element 100, the failure detection unit 10 detects a current equal to or more than the predetermined value and determines that a failure occurs and in a case where when a potential difference is provided between the third leakage current detection element 111 and the fourth leakage current detection element 110, the failure detection unit 10 detects a current equal to or less than the predetermined value.

Here, as illustrated in FIG. 7, the MOS 00 and the MOS 01 that are MOSFETs may be surrounded by DTI 200 and DTI 201, respectively and the MOS 10 and the MOS 11 that are MOSFETs may be surrounded by DTI 210 and DTI 211, respectively. In addition, as illustrated in FIG. 7, the load drive output unit 30 and the load drive output unit (redundant output unit) 31 may be surrounded by DTI 22 and DTI 23, respectively so as to insulate and separate the main circuit and the redundant circuit.

Figure 8:
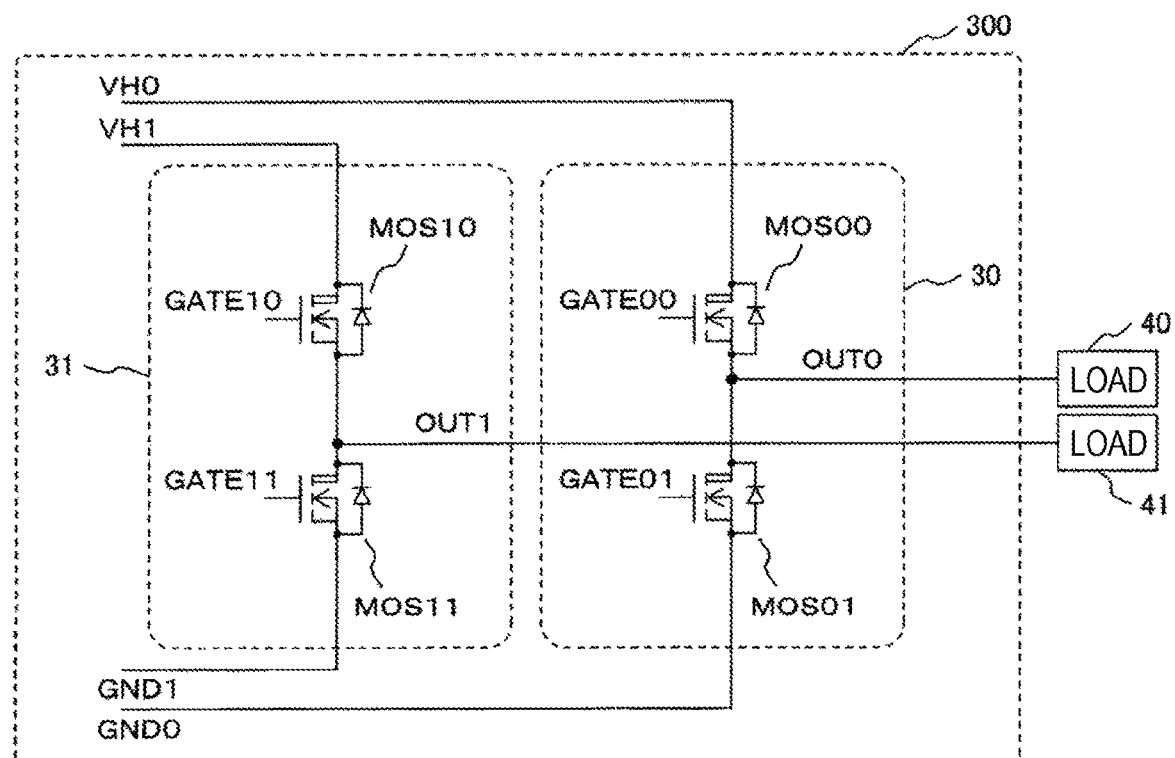
FIG. 8 is a diagram illustrating an example of an output circuit of the load drive apparatus in FIG. 7.
Figure 9:
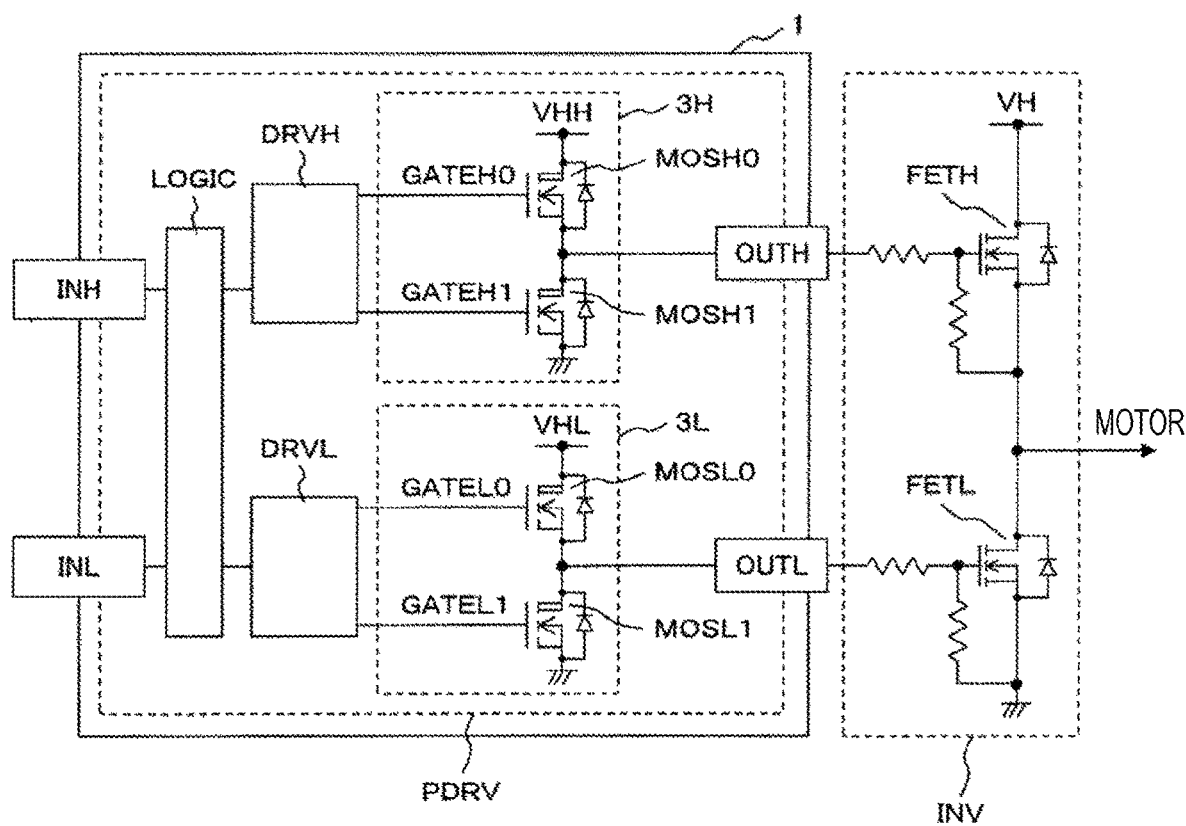
FIG. 9 is a block diagram illustrating a configuration example (one phase portion) of a motor drive circuit.

FIG. 8 illustrates an example of an output circuit of the load drive apparatus 300 illustrated in FIG. 7. The load drive apparatus 300 includes the load drive output unit 30 and the redundant output unit (load drive output unit) 31 thereof. The load drive output unit 30 includes the MOS 00 that is an Nch LDMOS whose drain side is connected to a power source VH0 and whose source side is connected to an output OUT0 and the MOS 01 that is an Nch LDMOS whose drain side is connected to the output OUT0 and Whose source side is connected to a ground GND0, the output OUT0 is connected to a load 40, and the load 40 is driven by turning on and off between the drain and the source of the LDMOS that is the MOSFET, on the basis of the H level and the L level of the gate signal GATE00 of the MOS 00 and the gate signal GATE01 of the MOS 01.

In addition, the redundant output unit (load drive output unit) 31 includes the MOS 10 that is an Nch LDMOS whose drain side is connected to a power source VH1 and whose source side is connected to an output OUT1 and the MOS 11 that is an Nch LDMOS whose drain side is connected to the output OUT1 and whose source side is connected to a ground GND1, the output OUT1 is connected to a load 41, and the load 41 is driven by turning on and off between the drain and the source of the LDMOS that is the MOSFET, on the basis of the H level and the L level of a gate signal GATE10 of the MOS 10 and a gate signal GATE11 of the MOS 11.

With respect to the load drive output unit 30 and the redundant output unit 31, with the leakage current detection elements 100 and 101 and the leakage current detection elements 110 and 111 respectively, it is possible to diagnose that the dielectric strength voltages of the DTI 20 and the DTI 21 lowers, by using the failure detection unit 10 illustrated in FIG. 3 of the first embodiment.

In a case where with respect to the load drive output unit 30, the failure diagnosis of the DTI 20 is performed by the leakage current detection elements 100 and 101 and it is found that the dielectric strength voltage lowers, there is a possibility that lowering of the dielectric strength voltage occurs due to the influence of the disturbance surge at the time of using the load drive apparatus 300 and there is a possibility that the influence also occurs in the redundant output unit (load drive output unit) 31. Therefore, in a case where with respect to the load drive output unit 30, a failure is detected, the failure diagnosis of the DTI 21 is performed by the leakage current detection elements 110 and 111 with respect to the redundant output unit (load drive output unit) 31, then it is confirmed that the dielectric strength voltage does not lower, and after that, the load drive function of the load drive apparatus 300 is switched from the load drive output unit 30 to the redundant output unit (load drive output unit) 31.

As described above, according to the present embodiment, it is possible to diagnose that the dielectric strength voltage of the DTI lowers due to the influence of the disturbance surge or aged deterioration at the time of using the load drive apparatus, and in the case of a configuration in which the load drive output unit is made redundant, it is also possible to switch to the redundant system after diagnosing that there is no problem in the electrical isolation of a redundant system circuit block, and it is possible to improve the reliability of the load drive apparatus.

Note that FIG. 7 illustrates an example in which the load drive output unit 30 and the redundant output unit (load drive output unit) 31 thereof that constitute the load drive apparatus 300 are mounted on the same semiconductor chip 1. However, a configuration in which the load drive output unit 30 and the redundant output unit (load drive output unit) 31 thereof are mounted on separate semiconductor chips may be used.

Note that the present invention is not limited to the above-described embodiments and includes various modifications. For example, the above-described embodiments have been described in detail to describe the present invention in detail in an easy-to-understand manner. Therefore, the present invention is not limited to an embodiment that includes all the configurations described above. In addition, a part of a configuration of an embodiment can be replaced with a configuration of another embodiment. In addition, a configuration of an embodiment can be added to a configuration of another embodiment. In addition, with respect to a part of the configuration in each embodiment, additions, deletions, substitutions of other configuration can be made.

In addition, control lines and signal lines indicate what is considered to be necessary for description, and not all control lines and signal lines for a product are not necessarily illustrated.

Note that the present invention also has features described below.

Supplementary Note 1

A failure diagnosis method of a load drive apparatus in which a semiconductor chip is mounted,
wherein in a case where a potential difference is provided between a first leakage current detection element provided in the same region as a region where an MOSFET that controls load driving is formed on a semiconductor substrate of the semiconductor chip and a second leakage current detection element provided in a region insulated and separated by DTI from the region where the MOSFET is formed and
a current equal to or more than a predetermined value is detected, it is diagnosed that the load drive apparatus is faulty.

Supplementary Note 2

The failure diagnosis method of a load drive apparatus as described above (Supplementary note 1),
wherein in a case where it is diagnosed that the load drive apparatus is faulty, when a potential difference is provided between a third leakage current detection element provided in the same region as a MOSFET that controls load driving on the semiconductor substrate on which a redundant circuit of the load drive apparatus is formed and a fourth leakage current detection element provided in a region insulated and separated by the DTI from the region where an MOSFET of the redundant circuit is formed and a current equal to or less than the predetermined value is detected, a load drive function is switched to the redundant circuit.

Supplementary Note 3

A failure diagnosis method of a load drive apparatus in which a semiconductor chip is mounted,
wherein in a case where a current is applied between a first leakage current detection element provided in the same region as a region where an MOSFET that controls load driving is formed on a semiconductor substrate of the semiconductor chip and a second leakage current detection element provided in a region insulated and separated by DTI from the region where the MOSFET is formed and
a voltage equal to or less than a predetermined value is detected, it is diagnosed that the load drive apparatus is faulty.

Supplementary Note 4

The failure diagnosis method of a load drive apparatus as described above (Supplementary note 3),
wherein in a case where it is diagnosed that the load drive apparatus is faulty, when a current is applied between a third leakage current detection element provided in the same region as the MOSFET that controls the load driving on the semiconductor substrate on which a redundant circuit of the load drive apparatus is formed and a fourth leakage current detection element provided in a region insulated and separated by the DTI from the region where the redundant circuit of the MOSFET is formed and a voltage equal to or more than a predetermined value is detected, a load drive function is switched to the redundant circuit.

REFERENCE SIGNS LIST 1 semiconductor chip
20, 21, 22, 23, 200, 201, 210, 211 DTI
3, 30, 31 load drive output unit
4, 40, 41 load
5 interlayer film
6 semiconductor substrate
70, 71 wiring
80, 81 conductive layer
90, 91 semiconductor layer
10 failure detection unit
11 current detection circuit
12 current source
13 voltage detection circuit
100, 101, 110, 111 leakage current detection element
300 load drive apparatus
VH power source
GND ground
MOS MOSFET
GATE gate signal
OUT output (signal)
DET failure detection signal

The invention claimed is:

1. A load drive apparatus in which a semiconductor chip is mounted,
wherein the semiconductor chip includes a load drive output unit formed on a semiconductor substrate,
the load drive output unit has a first region where an MOSFET that controls load driving is formed and a second region insulated and separated by DTI from the first region, and
wherein the load drive output unit includes:
a first leakage current detection element provided in the first region;
a second leakage current detection element provided in the second region; and
a failure detection unit that determines a failure of the load drive output unit.

2. The load drive apparatus according to claim 1,
wherein in a case where a potential difference is provided between the first leakage current detection element and the second leakage current detection element and a current equal to or more than a predetermined value is detected, the failure detection unit determines that the load drive output unit is faulty.

3. The load drive apparatus according to claim 1,
wherein in a case where a current is applied between the first leakage current detection element and the second leakage current detection element and a voltage equal to or less than a predetermined value is detected, the failure detection unit determines that the load drive output unit is faulty.

4. The load drive apparatus according to claim 1,
wherein the semiconductor chip includes a redundant output unit of the load drive output unit,
wherein the redundant output unit includes a third region where an MOSFET that controls load driving is formed and a fourth region insulated and separated by DTI from the third region, and
wherein the redundant output unit includes:
a third leakage current detection element provided in the third region; and
a fourth leakage current detection element provided in the fourth region.

5. The load drive apparatus according to claim 4,
wherein in a case where the failure detection unit determines that the load drive output unit is faulty, when a potential difference is provided between the third leakage current detection element and the fourth leakage current detection element and a current equal to or less than a predetermined value is detected, a load drive function is switched from the load drive output unit to the redundant output unit.

6. The load drive apparatus according to claim 4,
wherein in a case where the failure detection unit determines that the load drive output unit is faulty, when a current is applied between the third leakage current detection element and the fourth leakage current detection element and a voltage equal to or more than a predetermined value is detected, the load drive function is switched from the load drive output unit to the redundant output unit.

7. The load drive apparatus according to claim 1,
wherein the load drive apparatus includes a redundant output unit of the load drive output unit formed on a semiconductor substrate of another semiconductor chip different from the semiconductor chip,
wherein the redundant output unit has a third region where an MOSFET that controls load driving is formed and a fourth region insulated and separated by DTI from the third region, and
wherein the redundant output unit includes:
a third leakage current detection element provided in the third region; and
a fourth leakage current detection element provided in the fourth region.

8. The load drive apparatus according to claim 7,
wherein in a case where the failure detection unit determines that the load drive output unit is faulty, when a potential difference is provided between the third leakage current detection element and the fourth leakage current detection element and a current equal to or less than a predetermined value is detected, the load drive function is switched from the load drive output unit to the redundant output unit.

9. The load drive apparatus according to claim 7,
wherein in a case where the failure detection unit determines that the load drive output unit is faulty, when a current is applied between the third leakage current detection element and the fourth leakage current detection element and a voltage equal to or more than a predetermined value is detected, the load drive function is switched from the load drive output unit to the redundant output unit.

10. The load drive apparatus according to claim 1,
wherein the failure detection unit determines a failure of the load drive output unit on-board.

11. The load drive apparatus according to claim 10,
wherein immediately after the load of the load drive apparatus is driven or before a power source is turned off, the failure detection unit performs a failure diagnosis of the load drive output unit.

12. The load drive apparatus according to claim 1,
wherein the semiconductor substrate is an SOI substrate.

* * * * *